United States Patent [19]

Lee

[11] Patent Number: 5,257,225
[45] Date of Patent: Oct. 26, 1993

[54] METHOD FOR PROGRAMMING PROGRAMMABLE DEVICES BY UTILIZING SINGLE OR MULTIPLE PULSES VARYING IN PULSE WIDTH AND AMPLITUDE

[75] Inventor: Roger R. Lee, Boise, Id.

[73] Assignee: Micron Technology, Inc., Boise, Id.

[21] Appl. No.: 850,739

[22] Filed: Mar. 12, 1992

[51] Int. Cl.$^5$ .............................................. G11C 13/00
[52] U.S. Cl. ...................................... 365/185; 365/96
[58] Field of Search ......................... 365/185, 96, 203

[56] References Cited

U.S. PATENT DOCUMENTS 5,197,027 3/1993 Challa ................................ 365/185

Primary Examiner—Terrell W. Fears
Attorney, Agent, or Firm—David J. Paul

[57] ABSTRACT

The present invention comprises a method to program programmable structures in integrated circuits, such as programmable read-only memory (PROM), erasable programmable read-only memory family (EPROMS, EEPROMS, etc.) or option selections/redundancy repair on dynamic random access memories (DRAMs) by utilizing multiple programming pulses that vary in pulse width and amplitude. Multiple programming pulses (or a pulse train) of the present invention are applied to the desired structure to be programmed, whether that structure be a fuse in a bipolar PROM, an antifuse element in a CMOS PROM, an option selecting element (fuse or antifuse) in a DRAM, the programmable gates of the EPROM family (EEPROMs, Flash EEPROMS, etc.). The pulse train applied to the programmable structure may be as few as one pulse, having sufficient amplitude and pulse width, or the pulse train may be a plurality of pulses varying in pulse amplitude or pulse width. The amplitude of the programming pulse(s) may also be ramped up or down and a multiple pulse train may consists of a series of pulses wherein the first pulse may have a longer pulse width than a subsequent pulse. By adding these variables to the programming pulse train, optimal programming results can be obtained for each programmable structure.

25 Claims, 3 Drawing Sheets

METHOD FOR PROGRAMMING PROGRAMMABLE DEVICES BY UTILIZING SINGLE OR MULTIPLE PULSES VARYING IN PULSE WIDTH AND AMPLITUDE

FIELD OF THE INVENTION

This invention relates to the field of semiconductor devices. More specifically, a concept is described which allows programming of programmable devices in semiconductor devices, such as non-volatile memory devices and devices having option selecting programmable elements, by utilizing single or multiple programming pulses that vary in pulse width and amplitude.

BACKGROUND OF THE INVENTION

While volatile memories, such as dynamic random access memories (DRAMs) provide a method to store information, many applications today make use of non-volatile memories devices that will retain information even when power is removed.

Presently, virtually all nonvolatile memories are some type of read only memories (ROMs). The first group of nonvolatile memories consists of ROMs in which data is entered during manufacturing that cannot be subsequently altered. These devices are known as masked ROMS. The next group consists of memories whose data can be entered by the user. This group is known as a programmable ROM or PROM in which data can only be entered once.

In the remaining ROM types, data can be erased as well as entered. In one class of erasable ROMs, the cells must be exposed to a strong ultraviolet light in order for stored data to be erased. These ROMs are called erasable programmable ROMs, or EPROMs. In the final type, data can be electrically erased as well as entered in the device and are referred to as EEPROMs and flash EEPROMs.

There is one common element among the programmable structures that reside in PROMS, EPROMs, EEPROMs, Flash EEPROMs, and a RAM having programmable options available. That commonality is the need for an external programming scheme to either program in data or to program a one-time programmable element that is used to select certain options or to allow circuit repair of semiconductor device such as in DRAMs.

Conventionally, to program an element (in PROMs, DRAMs) or to charge a floating gate (in the EPROM family) a large external voltage typically in the neighborhood of 12-30 V is applied across the appropriate nodes to either rupture a fuse or antifuse or to charge a floating gate, whatever the case may be.

A new method of programming an antifuse element by using transistor snap-back is disclosed in copending application #821,501, by the same inventor, as herein incorporated by reference (Snap-back is a form of field effect transistor breakdown, a condition well known to one skilled in the art, where a positive-feedback mechanism exist between the substrate-source pn junction, thus allowing a large surge of current to flow through the source/drain terminals). A transistor operating in a snap-back condition theortically will allow an infinite amount of current to flow through the transistor's channel region and is limited only by the power source capabilities. And very importantly, studies have shown that a transistor operating during snap-back is not damaged if operated under AC pulse conditions. Using one of the programming options of the present invention, is an optimal way to take advantage of transistor snap-back for programming such elements as an antifuse as described in copending application #821,501, whereby the resistivity of a programmed antifuse element will be reduced to the desirable level of several hundred ohms.

The present invention introduces a method to program the above mentioned programmable integrated circuits by varying the programming pulse width and/or by ramping the pulse amplitude up or down to achieve optimum programming effect from the programming pulse.

SUMMARY OF THE INVENTION

The present invention provides a method of programming programmable devices, such as fuse or antifuse elements, or electrically programmable memories, by using single or multiple programming pulses having different pulse widths and/or ramping pulse amplitudes. The proposed programming method, presented hereinafter, may be used in lieu of conventional programming methods and is a method for gaining the optimal programming effect of a given programming scheme selected from the present invention.

Multiple programming pulses (or pulse train) of the present invention are applied to the desired structure to be programmed, whether that structure be a fuse in a bipolar PROM, an antifuse element in a CMOS PROM, an option selecting element (fuse or antifuse) in a DRAM, the programmable gates of the EPROM family (EEPROMs, Flash EEPROMS, etc.). The pulse train applied to the programmable structure may be as few as one pulse, having sufficient amplitude and pulse width, or the pulse train may be a plurality of pulses, varying in pulse amplitude, pulse width or any combination thereof. The amplitude of the programming pulse(s) may also be ramped up or down and a multiple pulse train may consists of a series of pulses wherein the first pulse may have a longer pulse width than a subsequent pulse.

By adding these variables to the programming pulse train, optimal programming results can be obtained for each programmable structure. For example, using this technique to program an antifuse would result in an optimal low resistive element by selecting the ideal set of programming pulses.

Though the present invention suggests using the a multiple programming pulse train having varying pulse amplitude and pulse width to programmable structures in DRAMs, and members of the PROM family, it will be obvious to one skilled in the art to implement this approach into other programmable integrated circuits, such as programmable logic arrays (PLAs), programmable array logic (PALs), or simply logic circuits in general.

BRIEF DESCRIPTION OF THE DRAWINGS

FIG. 5b depicts a specific implementation of the programming scheme of FIG. 1 which is used to program the programmable element of FIG. 5a;

FIG. 5c depicts a specific implementation of the programming scheme of FIG. 2 which is used to program the programmable element of FIG. 5a;

FIG. 6b depicts a specific implementation of the programming scheme of FIG. 3 which is used to program the electrically programmable NMOS transistor of FIG. 6a.

DETAILED DESCRIPTION OF THE PREFERRED EMBODIMENTS

The present invention will be discussed generally and then for sake of illustration, discussed specifically in light of using a transistor snap-back programming method to program an antifuse and to program a floating gate to an EPROM. However, as earlier pointed out, the present invention may be implemented for programming any programmable device that utilizes voltage pulses for programming.

Figure 1:
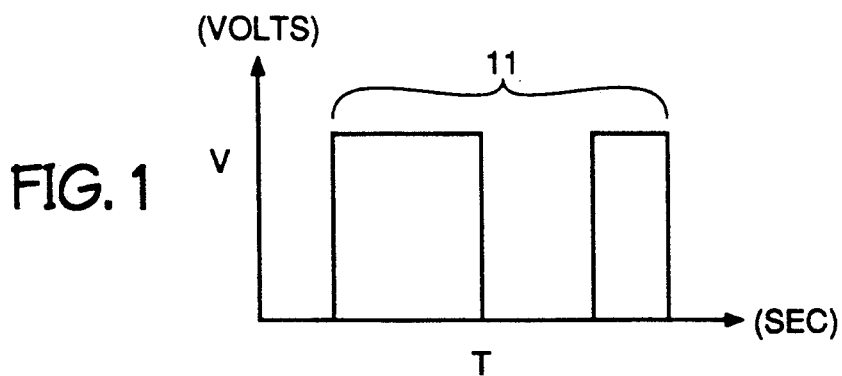
FIG. 1 depicts a first embodiment of a programming pulse train having two programming pulses that vary in pulse width.

In a first embodiment, referring now to FIG. 1, a programming pulse train 11, having two programming pulses, is applied to a given programmable device. The amplitude of these pulses will depend on the structure that one skilled in the art is desiring to program. The range could conceivably be as high as 30 V or higher, or as low as 10 V or lower, depending on present and future developments in fabrication of a programmable device. Taking the case for transistor snap-back programming of an antifuse in a PROM, 12–16 V may be sufficient however, as one skilled in the art will recognize the voltage pulse applied to an antifuse will depend on such factors as the dielectric thickness separating the two conductive elements of the antifuse, etc.

Figure 5A:
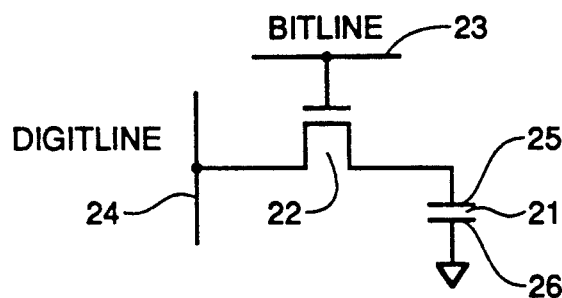
FIG. 5a depicts a schematical representation of a programmable element connected to an access NMOS transistor.
Figure 5B:
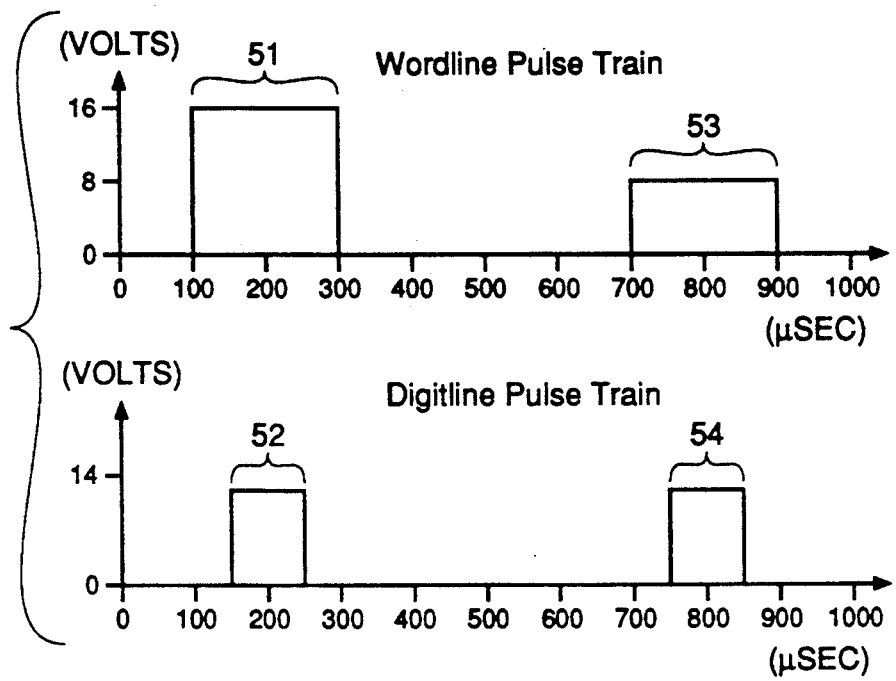

Using the present invention in order to program the antifuse mentioned above, the programming pulse train of FIG. 1 is reproduced in FIG. 5b to provide a specific example of programming a antifuse configuration as depicted in FIG. 5a.

Referring now to FIGS. 5a and 5b, a wordline pulse train with a first pulse 51 having an amplitude of 16 V and a pulse width of approximately 100 μsec is applied to the wordline 23 (or gate of NMOS 22). During the same time period a digitline pulse train having a first pulse 52 is applied to digitline 24 (or drain of NMOS 22) that has a potential of 14 V and is shorter in duration than that of wordline pulse 51. Since the gate of NMOS transistor 22 is higher than its drain, NMOS 22 is on and the total voltage applied to the drain (14 V, digitline pulse 52) develops across antifuse element 21 which is a sufficient amount of voltage to rupture an innerlying antifuse dielectric (residing between plates 25 and 26), thereby forcing conductive plates 25 and 26 to short together.

Both pulses 51 and 52 return to a low voltage level (0 V. for example) with digitline pulse 52 returning low prior to wordline pulse 51. Next, a second pulse 53 (wordline pulse train) with an amplitude of 8 V having a pulse width of approximately 100 μsec, is applied to wordline 23, during which time a second digitline pulse 54 of 14 V (also being shorter in duration than the wordline pulse) is applied to digitline 24. The reduction of the wordline voltage causes NMOS transistor to operate in a snap-back condition which allows a large surge of drain current to flow through NMOS transistor 22 and thus to ground through shorted antifuse element 21. This large surge of drain current greatly reduces the resistivity of antifuse by approximately one order of magnitude thereby becoming a very low resistive short as is highly desired. NMOS transistor 22 returns to normal operation once the programming pulse trains either returns to 0 V or are removed. The digitline pulse train, as depicted, is only one scenario as different combinations may be applied to accomplish the above. For example, the same wordline pulse train may be applied while the digitline is held at a constant 14 V and the same results are obtained.

Figure 2:
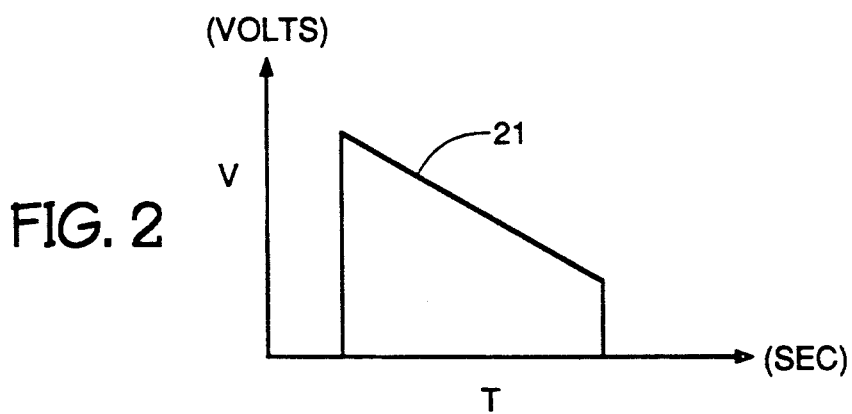
FIG. 2 depicts a second embodiment of a programming pulse train having one programming pulse with a ramping down pulse amplitude.
Figure 5C:
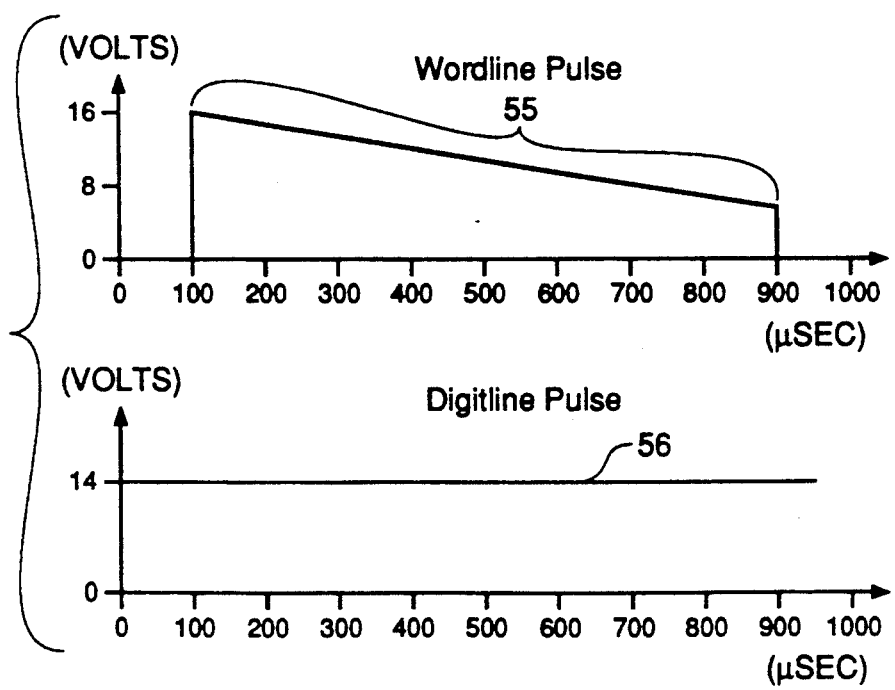

In a second embodiment, FIG. 2 shows a ramping down programming pulse 21 that may be configured as an alternative to applying the wordline and digitline pulse trains of FIG. 5b to program the antifuse element of FIG. 5a, an example of the ramping down pulse 21 of FIG. 2, as depicted in FIG. 5c, may be used.

Referring now to FIGS. 5a and 5c, ramping down wordline pulse 55 is presented to wordline 23. Wordline pulse 55 starts at 16 V while digitline pulse 56 is held at 14 V which causes NMOS transistor 22 to remain on and since at this point antifuse element 21 is still open, no currents flow through transistor 22 nor through antifuse element 21. Therefore, full digitline voltage (14 V) develops across the antifuse element 21 and ruptures the antifuse dielectric separating plates 25 and 26, due to internal electric field build-up, thereby shorting plates 25 and 26 together. Immediately after the antifuse dielectric is ruptured, the resistance of antifuse 21 is still relatively high (in the order of several thousand ohms) and a high current is needed to flow through antifuse 21 in order to generate enough heat to further lower the resistance (The higher the current the lower the resistance it will be).

Because transistor snapback will occur somewhere in the range of the decreasing wordline voltage (approximately 8 V) a large surge of current now flows through NMOS 22 and antifuse element 21, thereby reducing the resistance of antifuse element 21. It is important to note that the initial high voltage magnitude of the wordline pulse is necessary so that the full voltage on the digitline will develop across the antifuse dielectric. In other words, the initial voltage magnitude on the wordline must be at least one Vt higher than the digitline voltage.

Figure 3:
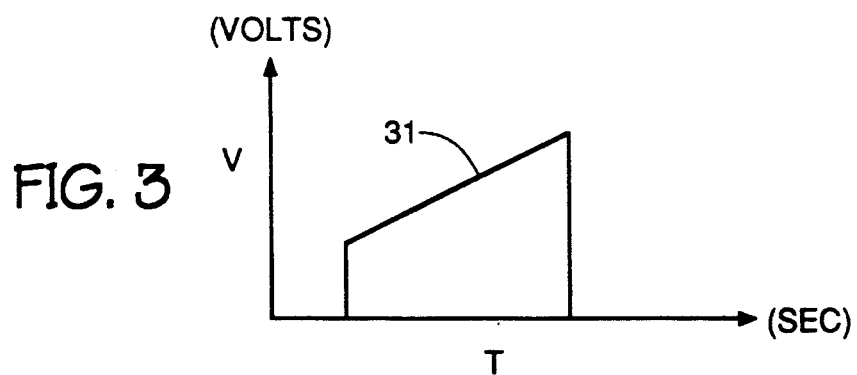
FIG. 3 depicts a third embodiment of a programming pulse train having one programming pulse with a ramping down pulse amplitude.
Figure 6A:
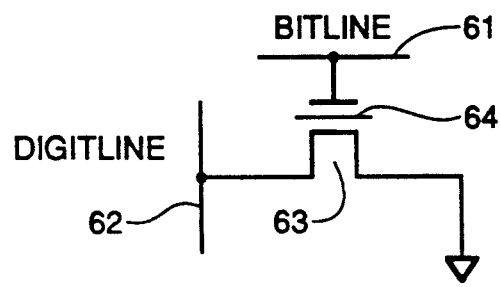
FIG. 6a depicts a schematical representation of an electrically programmable NMOS transistor.
Figure 6B:
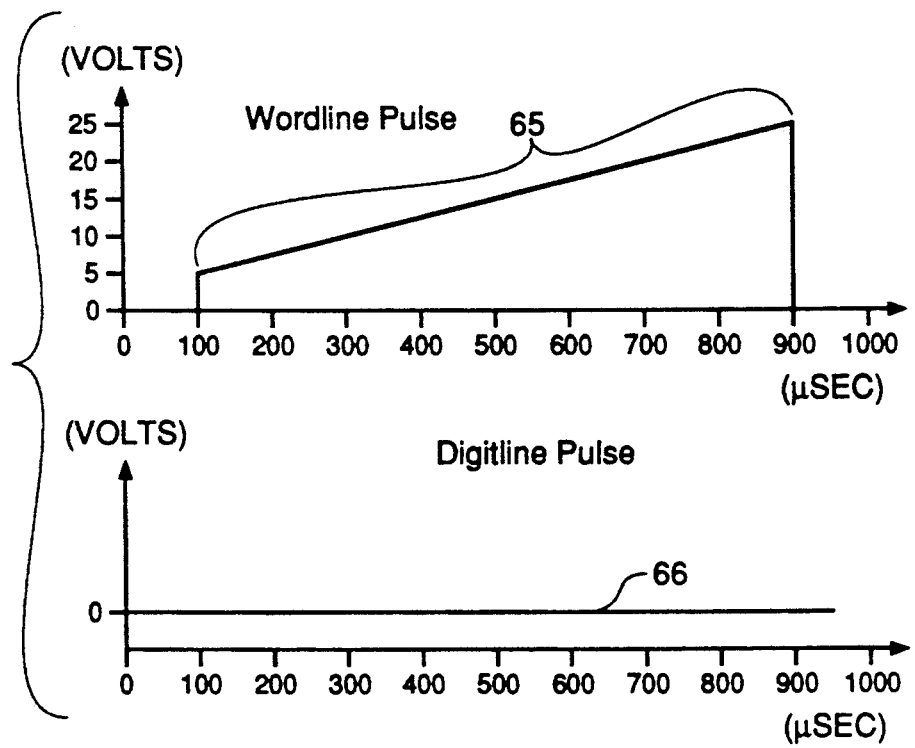

In a third embodiment, the ramping up pulse 31 of FIG. 3 may be used in such programming applications as for programming the Flash EEPROM memory cell depicted in FIG. 6a. A programming scenario utilizing pulse 31 of FIG. 3 is depicted in FIG. 6b. The ramping up wordline pulse 65, at a magnitude of 5 V, (of FIG. 6b) is applied to wordline 61 (or the gate of NMOS 63), while the drain of NMOS transistor 63 is held at a constant level of 0 V. As wordline pulse 65 ramps up, due to the coupling between the wordline 61 and the floating gate 64 of transistor 63, an electrical field between the floating gate 64 and the drain will increase and the tunneling current from the Fowler-Nerdheim mechanism will increase from the drain via the thin dielectric (or tunneling window) to floating gate 64. The fact that wordline pulse 65 ramps up is significant is that the small Fowler-Nerdheim current at the beginning which fills up the traps in the thin dielectric region before the higher Fowler-Nerdheim current will reduce the stress on the tunneling window dielectric and improve the dielectric lifetime.

Figure 4:
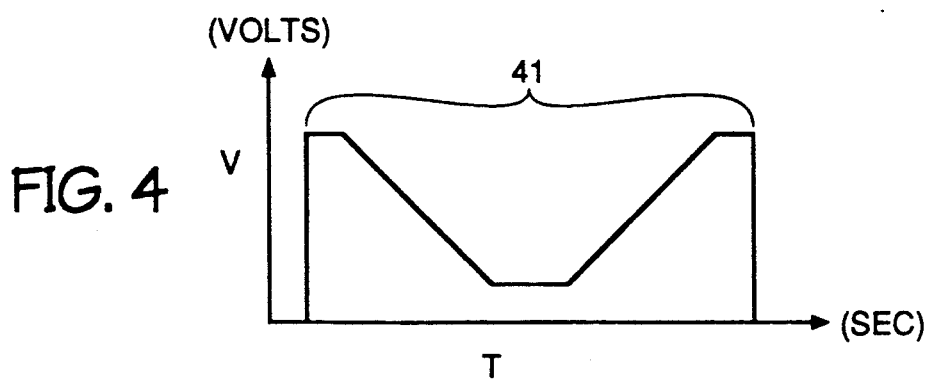
FIG. 4 depicts a fourth embodiment of a programming pulse train having one programming pulse with a ramping down and a ramping up pulse amplitude.

In a fourth embodiment, FIG. 4 shows a combination of a ramping down and ramping up programming pulse 41. This pulse combination could be substituted as the wordline pulse train in conjunction with the digitline pulse train of FIG. 5b and used to program the antifuse in FIG. 5a. The initial high amplitude of pulse 41 would cause the antifuse to rupture while the ramping down portion would allow transistor 22 to go into snapback and produce the current surge as pulse 41 once again ramps back up to a high potential.

It is to be understood that although the present invention has been described in several embodiments and in particular with reference to specific embodiments, various modifications known to those skilled in the art, such as adjusting the programming voltage or using this technique for other integrated circuits that utilize programmable structures, may be made to the method presented herein without departing from the invention as recited in the several claims appended hereto.

I claim:

1. A method to program a programmable device in a semiconductor device using varying programming pulses comprising the steps of:
   a) applying a first programming pulse train to a first access terminal electrically coupled to said programmable device; and
   b) applying a second programming pulse train to a second access terminal electrically coupled to said programmable device;
   wherein said applications of first and second programming pulse trains cause said programmable device to take on a determined programmed state.

2. The method of claim 1 wherein said programmable device is selected from the group consisting of fuses, antifuses and electrically programmable floating gates of MOS transistors.

3. The method of claim 1 wherein said semiconductor device is selected from the group consisting of bipolar PROMs, CMOS PROMs, DRAMs having programmable option selecting elements, and members of the EPROM family.

4. The method of claim 1 wherein said first programming pulse train comprises multiple pulses varying in amplitude.

5. The method of claim 1 wherein said first programming pulse train comprises multiple pulses varying in pulse width.

6. The method of claim 1 wherein said first programming pulse train comprises multiple pulses that varying in both pulse width and amplitude.

7. The method of claim 1 wherein said first programming pulse train comprises a single pulse varying in amplitude.

8. The method of claim 7 wherein said varying amplitude of said single pulse ramps up in amplitude.

9. The method of claim 7 wherein said varying amplitude of said single pulse ramps down in amplitude.

10. The method of claim 1 wherein said second programming pulse train comprises multiple pulses varying in amplitude.

11. The method of claim 1 wherein said second programming pulse train comprises multiple pulses varying in pulse width.

12. The method of claim 1 wherein said second programming pulse train comprises multiple pulses that varying in both pulse width and amplitude.

13. The method of claim 1 wherein said second programming pulse train comprises a single pulse varying in amplitude.

14. The method of claim 1 wherein said second programming pulse train comprises a single pulse of constant amplitude.

15. The method of claim 13 wherein s id varying amplitude of said single pulse ramps up in amplitude.

16. The method of claim 13 wherein said varying amplitude of said single pulse ramps down in amplitude.

17. A method to program a programmable antifuse element in a semiconductor device using varying programming pulses to utilize transistor snap-back, said method comprising the steps of:
   a) applying a first programming pulse train to a first terminal of said transistor, said transistor electrically coupled to said programmable antifuse element; and
   b) applying a second programming pulse train to a second terminal of said transistor;
   wherein the first pulses of said first and second programming pulse trains cause said programmable antifuse element to become a resistive short and the second pulses of said first and second programming pulse trains cause said transistor to operate in said snap-back condition and cause a surge of current to flow through said shorted antifuse element and thereby reduce the resistance of said antifuse element.

18. The method of claim 17 wherein said first programming pulse train further comprises multiple pulses with said first pulse having an amplitude greater than one MOS transistor threshold voltage of said first pulse of said second programming pulse train thereby forcing the amplitude of said first programming pulse to develop across said antifuse element and thereby rupturing the inner lying antifuse dielectric and causing said antifuse element to become a resistive short.

19. The method of claim 17 wherein said second pulse of said first programming pulse train being at a voltage level that causes said transistor to go into snap-back when the second pulse of said second programming pulse train transitions to a level greater than said second pulse of said first programming pulse train thereby causing said surge of current to flow through said shorted antifuse element.

20. The method of claim 18 wherein said first pulse of said first pulse train is a pulse having an amplitude of approximately 16 V and a pulse width of approximately 100 μsec and said first pulse of said second programming pulse train has an amplitude of approximately 14 V and a pulse width of less than 100 μsec.

21. The method of claim 19 wherein said second pulse of said first pulse train is a pulse having an amplitude of approximately 8 V and a pulse width of approximately 100 μsec and said second pulse of said second programming pulse
   train has an amplitude of approximately 14 V for a pulse width of less than 100 μsec.

22. The method of claim 17 wherein said first programming pulse train comprises a single pulse that ramps down in amplitude and a second pulse train that is at a constant amplitude, said first pulse of said first programming pulse train having an initial amplitude greater than one MOS transistor threshold voltage than said second programming pulse train thereby forcing amplitude of said first programming pulse to develop across said antifuse element and thereby rupturing the inner lying antifuse dielectric and causing said antifuse element to become a resistive short, said ramping down of said first programming pulse train decreasing below a voltage level that causes said transistor to go into snap-back when said second programming pulse train transitions to a level greater than said second pulse of said first programming pulse train thereby causing said surge of current to flow through said shorted antifuse element.

23. The method of claim 22 wherein said ramping down of said single pulse is between the amplitude range of 16-5 V and said constant amplitude of said second pulse train is approximately 14 V.

24. A method to program a MOS transistor's programmable floating gate in a semiconductor device using varying programming pulses, said method comprising the steps of:
 a) applying a first programming pulse to a first terminal of said transistor, said programming pulse ramping up in amplitude; and
 b) applying a second programming pulse to a second terminal of said transistor, said second programming pulse being at a constant amplitude;
 wherein said first programming pulse is initially below said constant level of said second programming pulse, said first programming pulse ramps up in amplitude greater than said constant amplitude of said second programming pulse thereby reducing the stress on floating gate's insulator while said floating gate becomes charged during amplitude ramp up.

25. The method of claim 24 wherein said ramping up of said first programming pulse is between the amplitude range of 5-25 V and said constant level of said second programmable pulse is approximately 0 V.

* * * * *